(12) United States Patent
Shirasawa et al.

(10) Patent No.: US 11,530,486 B2
(45) Date of Patent: Dec. 20, 2022

(54) CLEANING METHOD AND RECORDING MEDIUM FOR RECORDING CLEANING PROGRAM

(71) Applicant: Tokyo Electron Limited, Tokyo (JP)

(72) Inventors: Daisuke Shirasawa, Miyagi (JP); Naoki Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/016,394

(22) Filed: Sep. 10, 2020

(65) Prior Publication Data
US 2021/0079533 A1 Mar. 18, 2021

(30) Foreign Application Priority Data
Sep. 13, 2019 (JP) .............................. JP2019-167566

(51) Int. Cl.
*C23F 1/12* (2006.01)
*C23F 1/46* (2006.01)
*C23C 16/44* (2006.01)

(52) U.S. Cl.
CPC ............ *C23F 1/12* (2013.01); *C23C 16/4405* (2013.01); *C23F 1/46* (2013.01)

(58) Field of Classification Search
CPC ...... C23F 1/12; C23F 1/46; C23F 4/00; C23C 16/4405; H01J 2237/335
USPC ........................................................ 134/1–1.3
See application file for complete search history.

(56) References Cited

U.S. PATENT DOCUMENTS

| 9,870,899 | B2 | 1/2018 | Yang et al. | |
| 2014/0083451 | A1* | 3/2014 | Yin | H01J 37/32862 134/1.1 |
| 2015/0144154 | A1* | 5/2015 | Cho | H01J 37/32862 134/1.1 |
| 2018/0102236 | A1 | 4/2018 | Yang et al. | |
| 2020/0294777 | A1* | 9/2020 | Hirota | H01L 22/26 |

FOREIGN PATENT DOCUMENTS

JP  2016-208027 A  12/2016

OTHER PUBLICATIONS

Refractory, Wikipedia (Year: 2020).*

* cited by examiner

*Primary Examiner* — Duy Vu N Deo

(74) *Attorney, Agent, or Firm* — Xsensus LLP

(57) ABSTRACT

A cleaning method for a by-product including a refractory material or a metal compound includes a reforming process and an etching process. In the reforming process, a surface of the by-product is reformed using nitrogen-containing gas and hydrogen-containing gas. In the etching process, the reformed surface is etched using halogen-containing gas and inert gas.

15 Claims, 7 Drawing Sheets

FIG.4

|  | INITIAL VALUE | Cl2/Ar 100/200 60s w N2/H2×1c | Cl2/Ar 100/200 20s w N2/H2×3c | Cl2/Ar 100/200 10s w N2/H2×6c |
|---|---|---|---|---|
| THICK-NESS | T=179 nm | T=166 nm | T=136 nm | T=120 nm |
| E/A [nm] | - | 13 | 43 | 59 |

FIG.5

|  | INITIAL VALUE | Cl2/Ar 100/200 60s w N2/H2 60s | Cl2/Ar 100/200 20s w N2/H2 60s |
|---|---|---|---|
| THICKNESS | T=179 nm | T=166 nm | T=165 nm |
| E/A [nm] | - | 13 | 14 |

FIG.6

|  | INITIAL VALUE | N2/H2 200/125 60s×1 | N2/H2 200/125 180s×1 |
|---|---|---|---|
| THICKNESS | T=179 nm | T=175 nm | T=173 nm |
| E/A [nm] | - | 4 | 6 |

FIG.7

|  | INITIAL VALUE | Cl2/Ar 100/200 w Ar/H2 | Cl2/Ar 100/200 w N2/H2 | Cl2/Ar 100/200 w N2 200 |
|---|---|---|---|---|
| THICK-NESS | T=191 nm | T=167 nm | T=142 nm | - |
|  | T=179 nm | - | T=136 nm | T=186 nm |
| E/A [nm] | T=191 nm | 24 | 49 | - |
|  | T=179 nm | - | 43 | 0 |

| | INITIAL VALUE | CF4/Ar 100/200 | CF4/Ar 100/200 w N2/H2 | N2/H2 200/125 |
|---|---|---|---|---|
| THICK-NESS | T=284 nm | T=220 nm | T=0 nm | T=268 nm |
| E/A [nm] | - | 64 | >284 | 16 |

CLEANING METHOD AND RECORDING MEDIUM FOR RECORDING CLEANING PROGRAM

CROSS-REFERENCE TO RELATED APPLICATIONS

The present application claims priority to and incorporates by reference the entire contents of Japanese Patent Application No. 2019-167566 filed in Japan on Sep. 13, 2019.

FIELD

Exemplary embodiments disclosed herein relate to a cleaning method and a recording medium for recording a cleaning program.

BACKGROUND

Conventionally available techniques for etching metal with low vapor pressure (hereinafter, referred to as refractory metal), for example, cobalt (Co) include a technique of selectively etching a cobalt layer between a mask and the cobalt layer by using BCl3/Ar (boron-containing halide gas).

[Patent Literature 1] Japanese Laid-open Patent Publication No. 2016-208027

The present disclosure provides a cleaning method capable of accelerating the cleaning of a refractory material or a metal compound, and a recording medium for recording a cleaning program.

SUMMARY

According to an aspect of a present disclosure, a cleaning method for a by-product including a refractory material or a metal compound, the cleaning method includes reforming a surface of the by-product using nitrogen-containing gas and hydrogen-containing gas and etching the reformed surface using halogen-containing gas and inert gas.

BRIEF DESCRIPTION OF DRAWINGS

FIG. 4 is a diagram illustrating results of an experiment performed with the number of cycles of N2/H2-containing gas changed;

FIG. 5 is a diagram illustrating results of an experiment performed with the processing time of Cl2/Ar-containing gas changed;

FIG. 6 is a diagram illustrating results of an experiment performed with the flow volume and the processing time of the N2/H2-containing gas changed;

FIG. 7 is a diagram illustrating results of an experiment of comparing reforming effects between N2 and H2;

DESCRIPTION OF EMBODIMENTS

Exemplary embodiments of a cleaning method and a recording medium for recording a cleaning program according to the disclosure will be explained in detail below with reference to the accompanying drawings. The disclosed technique is not limited to the embodiments explained below.

Conventionally available techniques for etching refractory metal, for example, cobalt include a technique of selectively etching a cobalt layer between a mask and the cobalt layer by using BCl3/Ar.

However, the refractory metal has a low vapor pressure and cannot be provided with ion energy. Thus, reaction by-products (hereinafter, referred to as deposit) including the refractory metal attached to a chamber inner wall of an etching apparatus are difficult to be cleaned. This results in a prolonged cleaning period and periodical parts exchange, so that cleaning efficiency is deteriorated. BCl3/Ar-containing gas may be used for the cleaning, but is not preferably used, due to a concern that particles will be generated due to a boron-based deposit because BCl3 is more corrosive than Cl2. The cleaning efficiency is deteriorated also in the cleaning of metal compounds such as TiO. All things considered, there has been a demand for acceleration of the cleaning of refractory materials and metal compounds.

Overall Configuration of Etching Apparatus 10

Figure 1:
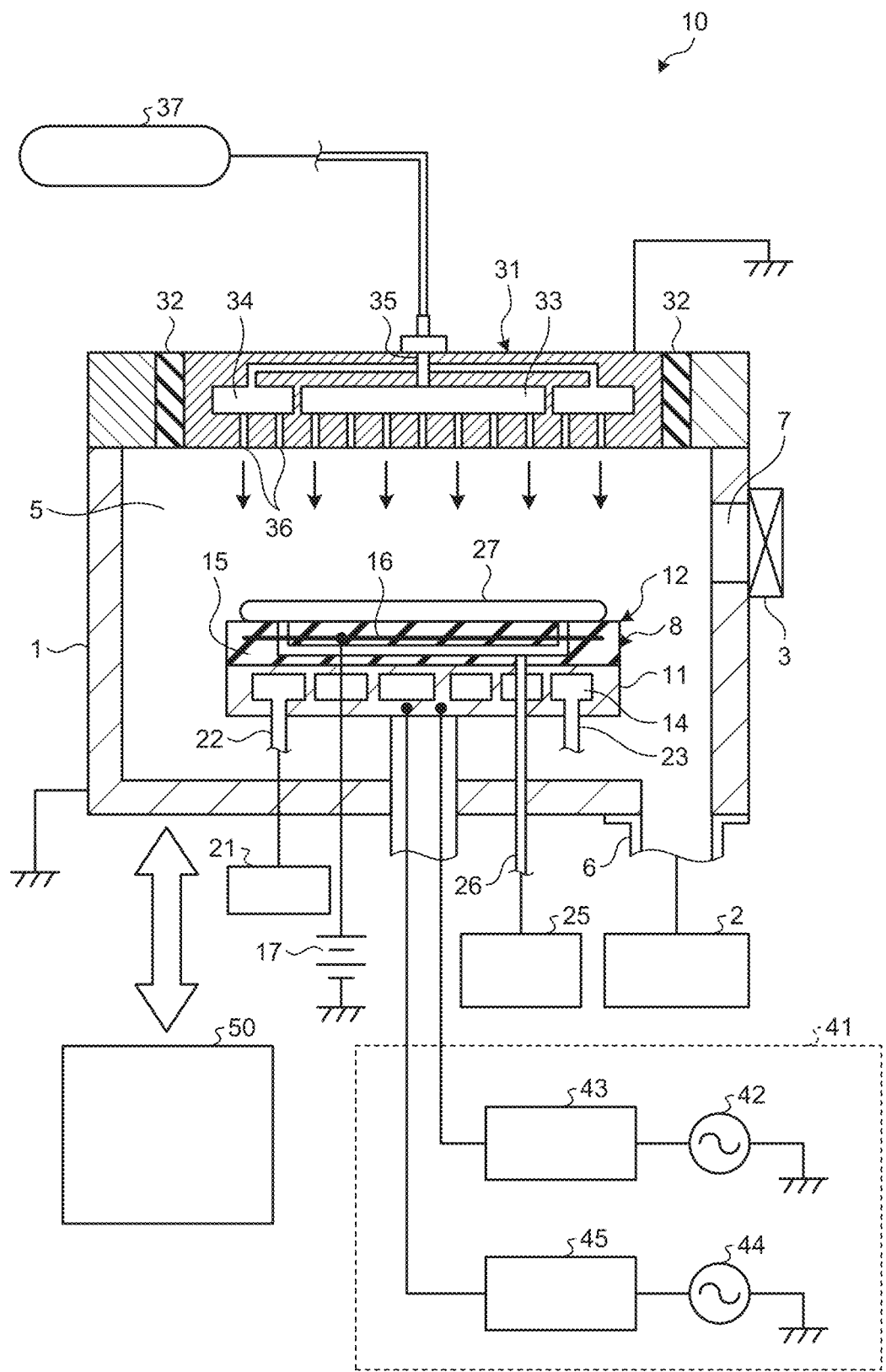
FIG. 1 is a vertical sectional view illustrating an example of an etching apparatus according to the present embodiment.

FIG. 1 is a vertical sectional view illustrating an example of an etching apparatus according to the present embodiment. The etching apparatus 10 illustrated in FIG. 1 is a capacitively coupled plasma processing apparatus. The etching apparatus 10 includes a chamber 1, an exhaust device 2, and a gate valve 3. The chamber 1 is made of, for example, aluminum. The chamber 1 is formed in a cylindrical shape, and its surface is alumited (anodized). The chamber 1 is electrically grounded. A processing space 5 is formed inside the chamber 1. The chamber 1 isolates the processing space 5 from the external atmosphere. The chamber 1 is further provided with an exhaust port 6 and an opening 7. The exhaust port 6 is provided in the bottom surface of the chamber 1. The opening 7 is provided in a side wall of the chamber 1. The exhaust device 2 is connected to the processing space 5 of the chamber 1 through the exhaust port 6. The exhaust device 2 discharges gas from the processing space 5 through the exhaust port 6. The gate valve 3 opens and closes the opening 7.

The etching apparatus 10 further includes a placing pedestal 8. The placing pedestal 8 is disposed in the processing space 5 and installed at a bottom portion of the chamber 1. The placing pedestal 8 includes a support table 11 and an electrostatic chuck 12. The support table 11 is made of a conductor examples of which include aluminum Al, titanium Ti, and silicon carbide SiC. The support table 11 is supported by the chamber 1. A refrigerant channel 14 is formed inside the support table 11. The electrostatic chuck 12 is disposed on the upper side of the support table 11 and is supported by the support table 11. The electrostatic chuck 12 includes an electrostatic chuck body 15 and a chuck electrode 16. The electrostatic chuck body 15 is made of an insulator. The electrostatic chuck 12 is formed by embedding the chuck electrode 16 inside the electrostatic chuck body 15. The etching apparatus 10 further includes a DC voltage source 17. The DC voltage source 17 is electrically connected to the chuck electrode 16 and supplies DC current to the chuck electrode 16.

The etching apparatus 10 further includes a chiller 21, a refrigerant inlet pipe 22, and a refrigerant outlet pipe 23. The chiller 21 is connected to the refrigerant channel 14 via the refrigerant inlet pipe 22 and the refrigerant outlet pipe 23. The chiller 21 cools a cooling medium examples of which include cooling water and brine, and circulates the cooled cooling medium in the refrigerant channel 14 through the refrigerant inlet pipe 22 and the refrigerant outlet pipe 23 to cool the electrostatic chuck 12 on the placing pedestal 8.

The etching apparatus 10 further includes a heat transfer gas supply source 25 and a heat transfer gas supply line 26. The heat transfer gas supply line 26 is formed to have one end formed on the upper surface of the electrostatic chuck 12. The heat transfer gas supply source 25 supplies a heat transfer gas, examples of which include helium gas He and argon gas Ar, to the heat transfer gas supply line 26, and supplies the heat transfer gas between a wafer (substrate) 27 and the electrostatic chuck 12 placed on the placing pedestal 8.

The etching apparatus 10 further includes a gas shower head 31 and a shield ring 32. The gas shower head 31 is made of a conductor and has a disk shape. The gas shower head 31 is arranged to face the placing pedestal 8, and to have a plane along the lower surface of the gas shower head 31 extending substantially parallel with a plane along the upper surface of the placing pedestal 8. The gas shower head 31 is arranged also to close the opening formed in a ceiling portion of the chamber 1. The shield ring 32 is made of an insulator and has a ring shape. The shield ring 32 covers a circumference edge portion of the gas shower head 31. The gas shower head 31 is supported by the chamber 1 via the shield ring 32 so that the gas shower head 31 and the chamber 1 are insulated from each other. The gas shower head 31 is electrically grounded. A variable DC power supply may be connected to the gas shower head 31 to apply a predetermined DC voltage.

In the gas shower head 31, a center side diffusion chamber 33, an edge side diffusion chamber 34, a gas introduction port 35, and a plurality of gas supply holes 36 are formed. The center side diffusion chamber 33 is provided in the center inside the gas shower head 31. The edge side diffusion chamber 34 is formed on the edge side inside the gas shower head 31, and is provided between the edge of the gas shower head 31 and the center side diffusion chamber 33. The gas introduction port 35 is formed above the center side diffusion chamber 33 and the edge side diffusion chamber 34 of the gas shower head 31, and communicates with each of the center side diffusion chamber 33 and the edge side diffusion chamber 34. The plurality of gas supply holes 36 are formed below the center side diffusion chamber 33 and the edge side diffusion chamber 34 of the gas shower head 31, and communicate with the center side diffusion chamber 33 and the edge side diffusion chamber 34, as well as with the processing space 5.

The etching apparatus 10 further includes a processing gas supply source 37. The processing gas supply source 37 is connected to the gas introduction port 35. The processing gas supply source 37 supplies predetermined processing gas to the gas introduction port 35. The processing gas contains a plurality of gases. For example, the processing gas includes mixed gas of nitrogen-containing gas and hydrogen-containing gas (hereinafter, also referred to as $N_2/H_2$-containing gas) used as a first gas. For example, the processing gas further includes mixed gas of chlorine-containing gas and inert gas including noble gas such as Ar (hereinafter, also referred to as $Cl_2$/Ar-containing gas) used as a second gas. The processing gas may further have a predetermined compound added. Examples of the compound include compounds containing boron and fluorine.

The support table 11 of the placing pedestal 8 is used as a lower electrode, and the gas shower head 31 is used as an upper electrode. The etching apparatus 10 further includes a power supply device 41. The power supply device 41 includes a first radio frequency power supply 42, a first matcher 43, a second radio frequency power supply 44, and a second matcher 45. The first radio frequency power supply 42 is connected to the placing pedestal 8 via the first matcher 43. The first radio frequency power supply 42 supplies a first radio frequency at a first frequency (for example, 40 MHz) to the support table 11 of the placing pedestal 8 with predetermined power. The first matcher 43 matches load impedance with the internal (or output) impedance of the first radio frequency power supply 42. The first matcher 43 functions to make the internal impedance of the first radio frequency power supply 42 and the load impedance apparently match when plasma is generated in the processing space 5.

The second radio frequency power supply 44 is connected to the placing pedestal 8 via the second matcher 45. The second radio frequency power supply 44 supplies a second radio frequency at a second frequency (for example, 0.4 MHz), lower than the first frequency, to the placing pedestal 8 with predetermined power. The second matcher 45 matches load impedance with the internal (or output) impedance of the second radio frequency power supply 44. The second matcher 45 functions to make the internal impedance of the second radio frequency power supply 44 and the load impedance apparently match when plasma is generated in the processing space 5. Note that the first radio frequency and the second radio frequency applied to the placing pedestal 8 in the present embodiment may alternatively be applied to the gas shower head 31.

The etching apparatus 10 may further include a controller 50. The controller 50 may be a computer including a processor, a storage, an input device, a display device, and the like. The controller 50 controls each unit of the etching apparatus 10. An operator can perform a command input operation and the like using the input device of the controller 50 to manage the etching apparatus 10. Furthermore, the display device of the controller 50 can visualize and display the operation status of the etching apparatus 10. Furthermore, the storage of the controller 50 stores a control program and recipe data with which the processor controls various types of processing executed by the etching apparatus 10. The etching apparatus 10 executes desired processing with the processor of the controller 50 executing the control program and controlling each unit of the etching apparatus 10 based on the recipe data.

For example, the controller 50 controls each unit of the etching apparatus 10 to implement a cleaning method described below. As one detailed example, the controller 50 implements a cleaning method for cleaning the inner walls of the chamber 1 and the lower surface of the gas shower head 31, as well as by-products including a refractory material or a metal compound attached to peripheral parts such as a deposit shield. Specifically, the controller 50 performs a reforming process of reforming the surface of the by-products using nitrogen-containing gas and hydrogen-containing gas. The controller 50 performs an etching process of etching the reformed surface using halogen-containing gas and inert gas. As the halogen-containing gas and the inert gas, for example, Cl2/Ar-containing gas may be used. The reforming process and the etching process may be alternately repeated at least once.

Cleaning Method

Figure 2:
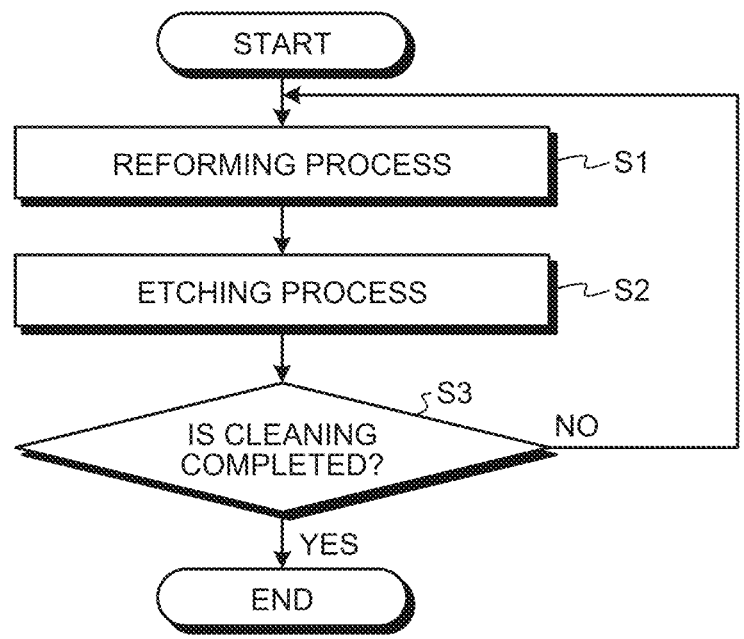
FIG. 2 is a flowchart illustrating an example of a cleaning method according to the present embodiment.

Next, the cleaning method according to the present embodiment will be described. FIG. 2 is a flowchart illustrating an example of the cleaning method according to the present embodiment.

In the cleaning method (cleaning process) according to the present embodiment, first of all, the controller 50 controls the gate valve 3 in a state where the wafer (substrate) 27 is not loaded into the chamber 1, to close the opening 7. When the opening 7 is closed, the controller 50 controls the exhaust device 2 to discharge gas from the processing space 5 so that the predetermined degree of vacuum is achieved in the atmosphere of the processing space 5.

The controller 50 controls the processing gas supply source 37 to supply the processing gas of a predetermined composition to the gas introduction port 35. The processing gas is supplied to the gas introduction port 35 and then is supplied to the center side diffusion chamber 33 and the edge side diffusion chamber 34, to be diffused in the center side diffusion chamber 33 and the edge side diffusion chamber 34. The processing gas diffused in the center side diffusion chamber 33 and the edge side diffusion chamber 34 is then supplied into the processing space 5 of the chamber 1 through the plurality of gas supply holes 36 in a shower form and filled in the processing space 5. Thus, the controller 50 supplies the N2/H2-containing gas, which is the first gas, to the processing space 5 as the processing gas.

The controller 50 controls the first radio frequency power supply 42 and the second radio frequency power supply 44 to supply the first radio frequency for plasma excitation and the second radio frequency for bias to the placing pedestal 8. When the first radio frequency is supplied to the placing pedestal 8, plasma is generated in the processing space 5. The plasma causes nitrogen atoms and hydrogen atoms to collide on the inner walls of the chamber 1 and the like. Thus, the surface of the by-products (deposit) attached to the inner walls of the chamber 1 and the like is reformed. A region in which the plasma is generated is controlled by the second radio frequency supplied to the placing pedestal 8. Thus, the controller 50 executes the reforming process of reforming the surface of the by-products (deposit) attached to the inner walls of the chamber 1 and the like, using the N2/H2-containing gas (step S1).

Next, the controller 50 supplies the Cl2/Ar-containing gas, which is the second gas, to the processing space 5 as the processing gas. The controller 50 controls the first radio frequency power supply 42 and the second radio frequency power supply 44 to supply the first radio frequency for plasma excitation and the second radio frequency for bias to the placing pedestal 8. When the first radio frequency is supplied to the placing pedestal 8, plasma is generated in the processing space 5. The plasma causes chlorine atoms and argon atoms to collide with the inner walls of the chamber 1 and the like. Thus, the surfaces of the inner walls of the chamber 1 and the like are etched. The region in which the plasma is generated is controlled by the second radio frequency supplied to the placing pedestal 8, as in the reforming process. Thus, the controller 50 performs an etching process of etching the reformed by-product (deposit) surfaces, using the Cl2/Ar-containing gas (step S2).

The controller 50 executes the reforming process and the etching process in steps S1 and S2, under the following processing conditions, for example.
(Reforming Process)
Pressure in chamber 1: 2.666 Pa (20 mTorr)
Processing gas (first gas): N2/H2-containing gas
Processing gas flow volume: N2/H2=100/200 sccm
Processing time: 20 seconds
(Etching Process)
Pressure in chamber 1: 2.666 Pa (20 mTorr)
Processing gas (second gas): Cl2/Ar-containing gas
Processing gas flow volume: Cl2/Ar=100/200 sccm
Processing time: 20 seconds The controller 50 determines whether the cleaning is completed based on a preset etching amount (step S3). The controller 50 determines whether the cleaning is completed, for example, by calculating the number of repeated cycles based on the preset etching amount and determining whether the repetition for the calculated number of cycles has been completed. The number of repeated cycles can be set to three cycles, for example. When the controller 50 determines that the cleaning is not yet completed (step S3: No), the processing returns to step S1 and the reforming and the etching are performed again. When the controller 50 determines that the cleaning is completed (step S3: Yes), the cleaning process ends. Thus, the cleaning of the refractory material such as cobalt can be accelerated. The present embodiment can achieve cobalt etching performance that is several times higher than that in the case of the BCl3/Ar-containing gas.

Reforming and Etching Model

Figure 3:
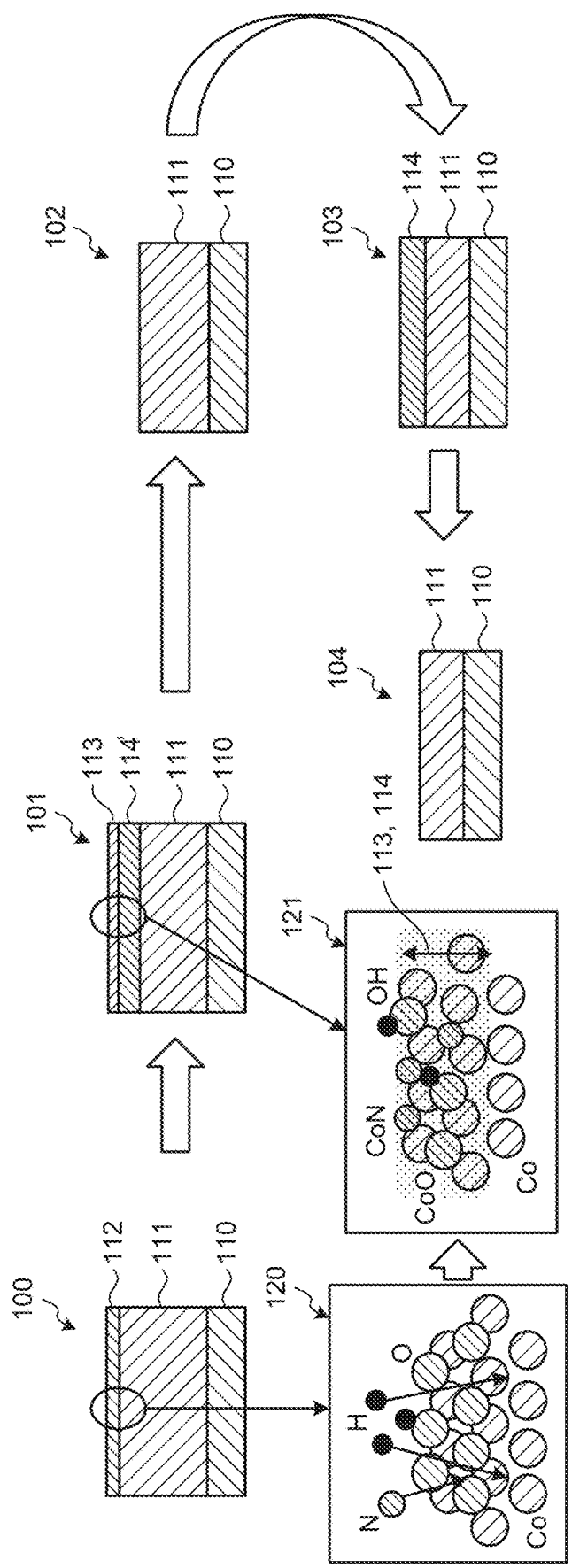
FIG. 3 is a diagram schematically illustrating reforming and etching according to the present embodiment.

FIG. 3 is a diagram schematically illustrating reforming and etching according to the present embodiment. The description with reference to FIG. 3 is given using a substrate 110 placed on the placing pedestal 8, instead of the inner walls of the chamber 1 and the like. It should be noted that the substrate 110 is evaluated in a state with no energy applied to the substrate 110, to be in the same condition as the inner walls of the chamber 1 and the like. As illustrated in FIG. 3, a state 100 corresponds to the state of the deposit on the inner walls of the chamber 1 and the like after the cobalt (Co) etching process is performed in the etching apparatus 10. In the state 100, a cobalt layer 111 is deposited on the substrate 110, and an oxide film 112 is formed on the surface of the cobalt layer 111. Note that the oxide film 112 is generated by, for example, bonding with oxygen (O2) in the cobalt etching process or the like.

The controller 50 performs the reforming process on the substrate 110 in the state 100, using the N2/H2-containing gas. As illustrated in a state 120 that is an enlarged view of an area around the surface of the substrate 110, the nitrogen atoms and the hydrogen atoms collide with CoO and Co(OH)x in the oxide film. As a result, the hydrogen atoms break the bonds of Co—O and Co—Co and reduce Co. Meanwhile, the nitrogen atoms assist the reduction of Co.

In a state 101 where the reforming process is completed, the oxide film 112 is reformed to be a reformed layer 113, and an upper portion of the cobalt layer 111 is a damage layer 114. As illustrated in a state 121 that is an enlarged view of an area around the surface of the substrate 110 in the state 101, a range within a predetermined thickness from the surface is in a damaged state (the reformed layer 113 and the damage layer 114).

Next, the controller 50 performs the etching process using the Cl2/Ar-containing gas on the substrate 110 in the state 101. In a state 102 is a state where the etching process is completed, the reformed layer 113 and the damage layer 114 are etched, so that the cobalt layer 111 is exposed on the surface. In the state 102, the controller 50 performs the reforming process using the N2/H2-containing gas again. As illustrated in a state 103, the upper portion of the cobalt layer 111 is reformed to be the damage layer 114.

In the state 103, the controller 50 performs the etching process using the Cl2/Ar-containing gas again to etch the cobalt layer 111 step by step as illustrated in a state 104. In this manner, the controller 50 repeats the reforming process and the etching process, whereby the cobalt layer 111 deposited on the substrate 110 can be cleaned.

Experimental Results

Next, experimental results obtained by changing various conditions will be described with reference to FIGS. 4 to 7. FIG. 4 is a diagram illustrating results of an experiment performed with the number of cycles of the N2/H2-containing gas changed. FIG. 4 illustrates etching amounts of the cobalt layer 111 (thickness T=179 mm) illustrated in FIG. 3, obtained with the overall processing time set to 120 seconds and with the number of cycles of the N2/H2-containing gas changed. The flow volume of the Cl2/Ar-containing gas is 100/200 sccm.

In the diagram, "Cl2/Ar 100/200 60 s w N2/H2×1c" represents a case where the reforming process using the N2/H2-containing gas is performed for 60 seconds and then the etching process is performed using the Cl2/Ar-containing gas for 60 seconds. In this case, the thickness after processing is T=166 nm, and the etching amount is 13 nm.

In the diagram, "Cl2/Ar 100/200 20 s w N2/H2×3c" represents a case where a cycle of performing the reforming process using the N2/H2-containing gas for 20 seconds and then performing the etching process using the Cl2/Ar-containing gas for 20 seconds is repeated three times. In this case, the thickness after processing is T=136 nm, and the etching amount is 43 nm.

In the diagram, "Cl2/Ar 100/200 10 s w N2/H2×6c" represents a case where a cycle of performing the reforming process using the N2/H2-containing gas for 10 seconds and then performing the etching process using the Cl2/Ar-containing gas for 10 seconds is repeated six times. In this case, the thickness after processing is T=120 nm, and the etching amount is 59 nm. Thus, it can be seen from the experiment examples in FIG. 4 that the etching amount also increases with the number of cycles. Furthermore, the increase in the etching amount is smaller in the case of 10-second processes×six cycles than in the case of 20-second processes×three cycles. This indicates that the the effect of reforming by the N2/H2-containing gas is saturated.

FIG. 5 is a diagram illustrating results of an experiment performed with the processing time of the Cl2/Ar-containing gas changed. FIG. 5 illustrates etching amounts of the cobalt layer 111 (thickness T=179 mm) illustrated in FIG. 3, obtained with the processing time of the Cl2/Ar-containing gas changed. The flow volume of the Cl2/Ar-containing gas is 100/200 sccm.

In the diagram, "Cl2/Ar 100/200 60 s w N2/H2 60 s" represents a case where the reforming process using the N2/H2-containing gas is performed for 60 seconds and then the etching process is performed using the Cl2/Ar-containing gas for 60 seconds. In this case, the thickness after processing is T=166 nm, and the etching amount is 13 nm.

In the diagram, "Cl2/Ar 100/200 20 s w N2/H2 60 s" represents a case where the reforming process using the N2/H2-containing gas is performed for 60 seconds and then the etching process is performed using the Cl2/Ar-containing gas for 20 seconds. In this case, the thickness after processing is T=165 nm, and the etching amount is 14 nm. Thus, it can be seen from the experiment examples in FIG. 5 that the layer (including the damage layer) reformed by the N2/H2-containing gas is etched by the Cl2/Ar-containing gas. More specifically, it can be seen that the unreformed cobalt layer 111 is substantially not etched even when the etching process is performed for a longer period of time.

FIG. 6 is a diagram illustrating results of an experiment performed with the flow volume and the processing time of the N2/H2-containing gas changed. FIG. 6 illustrates etching amounts of the cobalt layer 111 (thickness T=179 mm) illustrated in FIG. 3, obtained with the flow volume and the processing time of the N2/H2-containing gas changed.

In the diagram, "N2/H2 200/125 60 s×1" represents a case where the reforming process is performed for 60 seconds using the N2/H2-containing gas with the flow volume set to 200/125 sccm. In this case, the thickness after processing is T=175 nm, and the etching amount is 4 nm.

In the diagram, "N2/H2 200/125 180 s×1" represents a case where the reforming process is performed for 180 seconds using the N2/H2-containing gas with the flow volume set to 200/125 sccm. In this case, the thickness after processing is T=173 nm, and the etching amount is 6 nm. Thus, it can be seen from the experimental examples in FIG. 6 that substantially no etching occurs with the N2/H2-containing gas.

FIG. 7 is a diagram illustrating results of an experiment of comparing reforming effects between N2 and H2. FIG. 7 illustrates comparison to see which of N2 and H2 exerts a higher reforming effect on the cobalt layer 111 (thickness T=191 nm, T=179 nm) illustrated in FIG. 3. For convenience of the experiment, two types of substrates 110 on which the cobalt layer 111 is deposited are used. The flow volume of the Cl2/Ar-containing gas is 100/200 sccm.

In the diagram, "Cl2/Ar 100/200 w Ar/H2" represents a case where a cycle of performing the reforming process using the Ar/H2-containing gas for 20 seconds and then performing the etching process using the Cl2/Ar-containing gas for 20 seconds is repeated three times. In this case, the thickness after processing becomes T=167 nm from T=191 nm, and the etching amount is 24 nm.

In the diagram, "Cl2/Ar 100/200 w N2/H2" represents a case where a cycle of performing the reforming process using the N2/H2-containing gas for 20 seconds and then performing the etching process using the Cl2/Ar-containing gas for 20 seconds is repeated three times. Also in this case, the thickness after processing on one substrate 110 becomes T=142 nm from T=191 nm, and the etching amount is 49 nm. The thickness after processing on the other substrate 110 becomes T=136 nm from T 32 179 nm, and the etching amount is 43 nm.

In the diagram, "Cl2/Ar 100/200 w N2 200" represents a case where a cycle of performing the reforming process using the N2-containing gas with the flow volume set to 200 sccm for 20 seconds and then performing the etching process using the Cl2/Ar-containing gas for 20 seconds is repeated three times. In this case, the film thickness after processing becomes T=186 nm from T=179 nm, and the etching amount is 0 nm. Thus, it can be seen from the experimental examples in FIG. 7 that H2 exerts the reforming effect, and N2 assists the reforming effect of H2.

Figure 8:
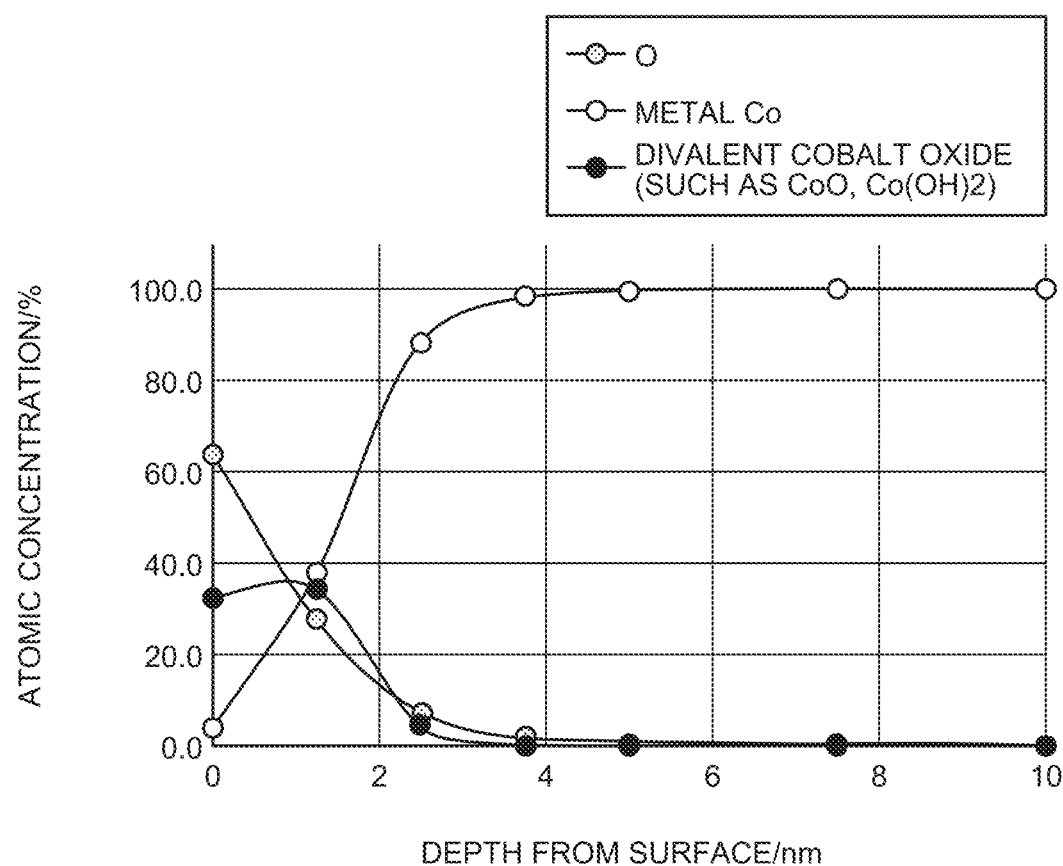
FIG. 8 is a graph illustrating an example of the composition of a cobalt surface before a reforming process.

Next, the analysis results of the composition of the cobalt surface before and after the reforming process, analyzed by X-ray Photoelectron Spectroscopy (XPS) will be described with reference to FIGS. 8 and 9. FIG. 8 is a graph illustrating an example of the composition of the cobalt surface before the reforming process. As illustrated in FIG. 8, the cobalt layer before the reforming process is covered with a surface oxide film with a thickness of about 3 nm. The surface oxide film is, for example, an oxide film that is naturally oxidized during transportation or by the atmosphere in the chamber 1, and mainly contains oxygen and divalent cobalt oxide (such as CoO, Co(OH)2).

Figures 9, 10:
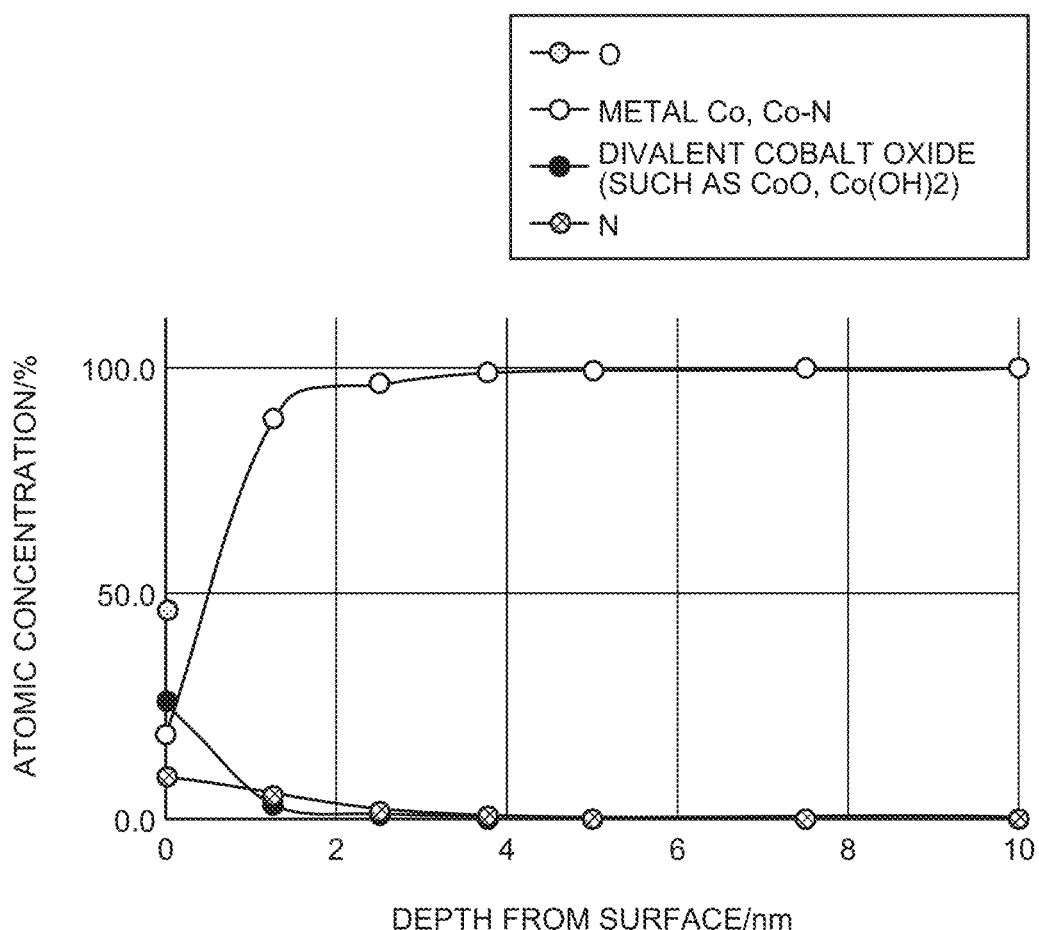
FIG. 9 is a graph illustrating an example of the composition of the cobalt surface after the reforming process.
FIG. 10 is a diagram illustrating experimental results obtained by application to TiO.

FIG. 9 is a graph illustrating an example of the composition of the cobalt surface after the reforming process. It can be seen in FIG. 9 that when the surface of the cobalt layer is reformed using the N2/H2-containing gas, approximately 40% of the cobalt oxide in the surface oxide film is reduced or nitrided, whereby oxygen is reduced. Although not illustrated in the graph, it has been found in the analysis using X-ray diffraction (XRD) that the reforming of the surface of the cobalt layer using the N2/H2-containing gas resulted in disordered crystallinity.

These analysis results indicate that in the cobalt layer, surface reduction by H2 and disorder of the crystallinity of the cobalt layer within approximately 10 nm occur. Furthermore, it can be seen that N2 promotes the reduction of the surface oxide film. As a result, the reformed layer and the damage layer formed by the N2/H2-containing gas are etched by the Cl2 plasma, whereby the cleaning of cobalt, which is a refractory material, can be accelerated.

Alternative Examples

The description of the above embodiment has been given with cobalt, which is a refractory material, serving as an example of the cleaning target, however the embodiment can be applied to cleaning of a metal compound such as TiO. The cleaning of TiO is performed through an etching process using, as the second gas, mixed gas (hereinafter, also referred to as CF4/Ar-containing gas) including: fluorine-containing gas (for example, carbon tetrafluoride (CF4)-containing gas) and inert gas including noble gas such as Ar, instead of Cl2/Ar-containing gas. The etching apparatus 10 and the cleaning process are the same as those in the above-mentioned embodiment, and thus the description thereof will be omitted.

FIG. 10 is a diagram illustrating experimental results obtained by the application to TiO. FIG. 10 illustrates a change in the etching amount of a TiO layer (thickness T=284 nm) depending on the presence or absence of the reforming with the N2/H2-containing gas. Furthermore, the etching amount using the N2/H2-containing gas alone is also illustrated. The flow volume of the CF4/Ar-containing gas is 100/200 sccm.

In the diagram, "CF4/Ar 100/200" represents a case where the etching process is performed for 60 seconds using the CF4/Ar-containing gas. In this case, the thickness after processing is T=220 nm, and the etching amount is 64 nm.

In the diagram, "CF4/Ar 100/200 w N2/H2" represents a case where the reforming process using the N2/H2-containing gas is performed for 60 seconds and then a cycle of performing the etching process using the CF4/Ar-containing gas for 20 seconds is repeated three times. In this case, the thickness after processing is T=0 nm, and the etching amount exceeds 284 nm, resulting in an over-etched state.

In the diagram, "N2/H2 200/125" represents a case where the reforming process is performed for 60 seconds using the N2/H2-containing gas with the flow volume set to 200/125 sccm. In this case, the thickness after processing is T=268 nm, and the etching amount is 16 nm. Thus, the cleaning can be accelerated by reforming the metal compound such as TiO using the N2/H2-containing gas.

As described above, according to the present embodiment, the controller 50 performs the cleaning of by-products including a refractory material or a metal compound. The controller 50 performs a reforming process of reforming the surface of the by-products using nitrogen-containing gas and hydrogen-containing gas. The controller 50 performs an etching process of etching the reformed surface using halogen-containing gas and inert gas. As a result, the cleaning of refractory materials and metal compounds can be accelerated.

According to the present embodiment, the by-products include a refractory material, and the halogen-containing gas is chlorine-containing gas. The controller 50 reduces the surface oxide film of the refractory material using the nitrogen-containing gas and the hydrogen-containing gas in the reforming process. The controller 50 etches the reduced surface oxide film using the chlorine-containing gas and inert gas in the etching process. As a result, cleaning of the refractory material can be accelerated.

According to the present embodiment, the refractory material is cobalt. Thus, cleaning of the cobalt can be accelerated.

According to an alternative example, the by-products include a metal compound and the halogen-containing gas is fluorine-containing gas. The controller 50 reduces the surface of the metal compound using the nitrogen-containing gas and the hydrogen-containing gas in the reforming process. The controller 50 etches the reduced surface using the fluorine-containing gas and inert gas in the etching process. Thus, cleaning of the metal compound can be accelerated.

Furthermore, according to an alternative example, the metal compound is TiO. Thus, cleaning of TiO can be accelerated.

According to the present embodiment, the reforming process and the etching process are alternately repeated. As a result, a desired amount of by-products can be removed without interrupting the cleaning of the by-products.

According to the present embodiment, the by-products are reaction by-products attached to the inner walls of the chamber 1 of the etching apparatus 10. Thus, the reaction by-products attached to the inner walls of the chamber 1 can be cleaned.

The embodiments disclosed herein are exemplary in any way, and thus should not be construed in a limiting sense. The above-described embodiments may be omitted, replaced, or modified in various ways without departing from the scope and spirit of the appended claims.

In the above-described embodiment, the etching apparatus 10 that performs processes such as etching on the wafer (substrate) 27 using capacitively coupled plasma as the plasma source is described as an example. However, the disclosed technique is not limited to this. The plasma source is not limited to capacitively coupled plasma as long as the apparatus processes the wafer 27 using plasma. Thus, for example, any plasma source such as inductively coupled plasma, microwave plasma, or magnetron plasma can be used.

Furthermore, in the above-described embodiment, cobalt and TiO are described as etching targets, but the present invention is not limited to this. For example, the etching targets may be zirconium (Zr), hafnium (Hf), and compounds of these (for example, zircon (ZrSiO4)).

Furthermore, in the above-described embodiment, the chlorine-containing gas or the fluorine-containing gas is used as the halogen-containing gas, but the halogen-con-

What is claimed is:

1. A method for cleaning a chamber inner wall of an etching apparatus, the method comprising:
   first reforming, by plasma generated from nitrogen-containing gas and hydrogen-containing gas, a surface oxide film of a refractory material or a metal compound attached to the chamber inner wall of the etching apparatus to form a reformed layer, and form a first damage layer below the reformed layer;
   first etching, by plasma generated from halogen-containing gas and inert gas, the formed reformed layer and the first damage layer to expose the refractory material or the metal compound;
   second reforming, by the plasma generated from the nitrogen-containing gas and the hydrogen-containing gas, the refractory material or the metal compound attached to the chamber inner wall of the etching apparatus to form a second damage layer; and
   second etching, by the plasma generated from the halogen-containing gas and the inert gas, the formed second damage layer,
   wherein the nitrogen-containing gas is $N_2$.

2. The method according to claim 1, wherein the second reforming and the second etching are repeated for a number of times after the first etching.

3. The method according to claim 1, wherein the halogen-containing gas is chlorine-containing gas, the first reforming includes reducing a surface oxide film of the refractory material using the nitrogen-containing gas and the hydrogen-containing gas, and the first etching includes etching the reduced surface oxide film using the chlorine-containing gas and the inert gas.

4. The method according to claim 3, wherein the chlorine-containing gas is $Cl_2$.

5. The method according to claim 1, wherein the refractory material is cobalt.

6. The method according to claim 1, wherein the halogen-containing gas is fluorine-containing gas, the first reforming and the second reforming include reducing a surface of the metal compound using the nitrogen-containing gas and the hydrogen-containing gas, and the first etching and the second etching include etching the reduced surface using the fluorine-containing gas and the inert gas.

7. The method according to claim 6, wherein the fluorine-containing gas is $CF_4$.

8. The method according to claim 1, wherein the metal compound is a metal oxide.

9. The method according to claim 8, wherein the metal oxide is TiO.

10. The method according to claim 1, wherein the hydrogen-containing gas is $H_2$.

11. The method according to claim 1, wherein the refractory material is zirconium (Zr) or hafnium.

12. The method according to claim 8, wherein the metal oxide is zircon ($ZrSiO_4$).

13. The method according to claim 1, wherein The halogen-containing gas is bromine-containing gas or iodine-containing gas.

14. A method for cleaning a chamber inner wall of an etching apparatus, the method comprising:
   first reforming, by plasma generated from nitrogen-containing gas and hydrogen-containing gas, a surface oxide film of a refractory material or a metal compound attached to the chamber inner wall of the etching apparatus to form a reformed layer, and form a first damage layer below the reformed layer;
   first etching, by plasma generated from fluorine-containing gas and inert gas, the formed reformed layer and the first damage layer to expose the refractory material or the metal compound;
   second reforming, by the plasma generated from the nitrogen-containing gas and the hydrogen-containing gas, the refractory material or the metal compound attached to the chamber inner wall of the etching apparatus to form a second damage layer; and
   second etching, by the plasma generated from the fluorine-containing gas and the inert gas, the formed second damage layer, wherein
   the first reforming and the second reforming include reducing a surface of the metal compound using the nitrogen-containing gas and the hydrogen-containing gas,
   the first etching and the second etching include etching the reduced surface using the fluorine-containing gas and the inert gas, and
   the second reforming and the second etching are repeated for a number of times after the first etching,
   wherein the nitrogen-containing gas is $N_2$.

15. The method according to claim 14, wherein the hydrogen-containing gas is $H_2$.

* * * * *